United States Patent [19]

Macey

[11] Patent Number: 4,885,532

[45] Date of Patent: Dec. 5, 1989

[54] APPARATUS FOR TESTING MULTIPHASE OUTLET WITH VISUAL INDICATION OF PHASE ENERGIZATION, PHASE ROTATION, AND SUPPLY VOLTAGE

[75] Inventor: Laurence D. Macey, Warners Bay, Australia

[73] Assignee: Macey Mining Services Pty. Ltd., Warners Bay, Australia

[21] Appl. No.: 235,413

[22] Filed: Aug. 24, 1988

[30] Foreign Application Priority Data

Aug. 24, 1987 [AU] Australia ................................ PI3935

[51] Int. Cl.[4] ............................................ G01R 19/14
[52] U.S. Cl. ..................................... 324/133; 324/86; 324/508; 324/556; 340/654; 361/76
[58] Field of Search ............... 324/133, 500, 508, 555, 324/86, 107, 108, 156, 66, 539, 540, 556; 361/76; 340/654

[56] References Cited

U.S. PATENT DOCUMENTS

| | | | |
|---|---|---|---|
| 3,156,868 | 11/1964 | Murrills | 324/108 |
| 3,922,600 | 11/1975 | Roveti | 324/508 |
| 4,034,284 | 7/1977 | Peplow et al. | 324/508 |
| 4,333,050 | 6/1982 | Yeasting | 324/133 |

FOREIGN PATENT DOCUMENTS

| | | | |
|---|---|---|---|
| 145099 | 3/1954 | Denmark | 324/86 |
| 1354707 | 5/1974 | United Kingdom . | |
| 1422326 | 1/1976 | United Kingdom . | |

Primary Examiner—Gerard R. Strecker
Assistant Examiner—Robert W. Mueller
Attorney, Agent, or Firm—W. E. Mouzavires

[57] ABSTRACT

The present invention discloses electrical testing apparatus to test an AC multiphase supply outlet. The apparatus is located within a flame proof enclosure and provides a visual indication of phase energization, direction of phase rotation, and supply voltage.

5 Claims, 4 Drawing Sheets

APPARATUS FOR TESTING MULTIPHASE OUTLET WITH VISUAL INDICATION OF PHASE ENERGIZATION, PHASE ROTATION, AND SUPPLY VOLTAGE

TECHNICAL FIELD

This invention relates to electrical apparatus and more particularly to apparatus adapted to test electrical equipment to ascertain whether or not that equipment is functioning effectively.

In its preferred form this invention is concerned with electrical testing equipment useful for the testing of electrical cables carrying three phase voltage of from, say, 600–1500 volts, used in underground mining applications.

BACKGROUND ART

The testing of electrical circuits in underground mining conditions is attended by danger in that such testing is usually carried out in situations where inflammable and/or explosive gases are present and a spark from testing operations can cause an explosion which can be dangerous to life. For this reason use of conventional multimeter testing equipment in underground mining operations is undesirable and has been banned in some jurisdictions.

It is thus an object of this invention to provide improved electrical testing equipment.

SUMMARY OF THE INVENTION

This invention in one broad form provides electrical testing apparatus for testing a multiphase alternating current supply outlet, said apparatus comprising a voltage dropping impedance network for each phase, and a corresponding phase energization indicator connected to each said voltage dropping impedance network, said networks and indicators being located within a housing with said indicators being visible from the exterior of said housing, and said housing having a socket connection for each phase compatible with said supply outlet and connected to the corresponding voltage dropping network.

It is preferred that the display indicia be neon lamps.

The circuit of this invention preferably additionally includes means to alter the aforesaid safe handling level voltage from AC to DC and to apply that DC current to a voltmeter. In this way an indication of the voltage available in each phase can be displayed on a meter. In this regard any conventional read out device will suffice, for example a standard voltmeter, a digital display or electronic metering.

It is further preferred that the electrical testing apparatus of this invention include circuitry adapted to receive said safe handling level voltage and to feed the same to one or other of two display indicia, again preferably neon lamps, the one lamp being adapted to light to indicate RYB three phase rotation direction, the other to indicate RBY three phase rotation direction.

It will be appreciated that electrical testing apparatus of this invention has great application in any situation where a three phase electrical supply is utilised. Such apparatus can be installed permanently in a cabinet, in a switchboard, in a transformer, in a powerhouse and in many other applications. It is of great benefit in underground mining operations where testing of three phase supply by conventional multimeters is either unlawful or, if legally permitted, dangerous. In these circumstances supply to machinery is afforded from the supply source via an extended cabling which terminates in a socket in the general area of location of the machinery to be activated. A short length of joining cable, which nevertheless weighs from 1 to 4 tons, is used to connect the supply from the socket to the machine. When a machine fails to operate, it is essential to test power supply and the first action is to remove such a joining cable to the pit top for testing. This operation may occupy up to 4 hours, whereas a device incorporating the testing apparatus of this invention may be used to test power supply underground in a matter of, at most, a few minutes.

Thus, such a device may be first used to test power supply from source at the aforesaid socket. If such test is positive, the joining cable may then be linked to the source cable and a further test effected at the outlet of the joining cable. If this test is positive, the fault clearly lies with the machinery as failure to activate is in evidence, and with the joining cable if this test is negative after a positive test result from the source cable.

The further benefit of the apparatus of this invention accruing from testing of phase rotation direction resides in avoidance of damage to machinery in the event that a machine is run backwards rather than forwards. Thus the apparatus of this invention may be utilized to test the direction of phase rotation before a machine is plugged into supply, avoiding damage which might otherwise arise.

BRIEF DESCRIPTION OF THE DRAWINGS

By way of example, one embodiment of testing apparatus according to this invention will now be described with reference to the accompanying drawings, wherein:

FIG. 2 shows a side section of the mechanical arrangement of a preferred embodiment of the monitor plug assembly;

FIG. 3 shows an end section of the plug assembly of FIG. 2 looking in the direction of arrow III in FIG. 2.

FIG. 4 shows a side section of the monitor plug body casting of the preferred embodiment;

FIG. 5 shows an end section of the monitor plug body casting of FIG. 4 looking in the direction of arrow V in FIG. 4.

FIG. 6 is an exploded longitudinal cross-sectional view of the fuse socket fuse holder and fuse lead assemblies of FIG. 2.

DESCRIPTION OF THE PREFERRED EMBODIMENT

Figure 1:
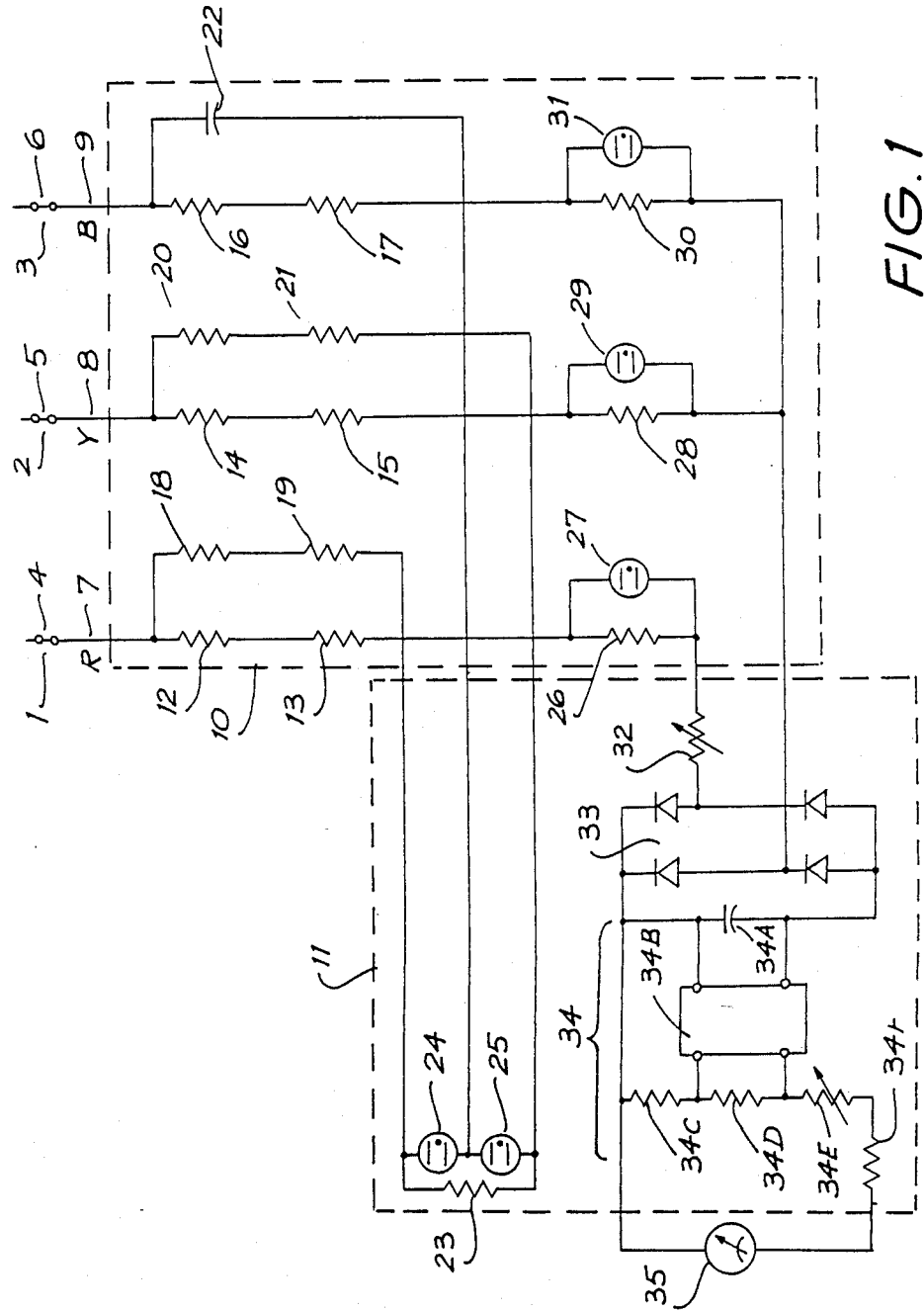
FIG. 1 is a circuit diagram of electrical testing equipment according to this invention.

The preferred embodiment of FIGS. 1–5 is shown mounted within a plug assembly adapted to be compatible with standard high voltage 300 amp plug assemblies commonly used in the Australian mining industry at 660 V or 1100 V ratings.

The features and circuitry of the preferred embodiment are equally suited for assembly into a 150 amp plug assembly also commonly used in the Australian mining industry.

Referring initially to FIG. 1 there is shown a schematic circuit diagram together with a general printed circuit board layout for the majority of the components comprising the circuit of the preferred embodiment. The elements of the three phase circuit to be tested are connected via a high voltage fuse and cable link, one for each phase, to a first PCB board 10. The high voltage fuse and lead assemblies 1, 2, 3 comprise, respectively, a high voltage HRC fuse 4, 5, 6, series connected to flexible leads 7, 8, 9. The leads 7, 8, 9 connect the respective RYB phases to resistive voltage dropping networks 12, 13; 14, 15; and 16, 17 respectively located on the first PCB 10.

The voltage dropping resistors 13, 15, 17 are series connected to respective neon light assemblies, each comprising a neon voltage dropping resistor 26, 28, 30 together with a parallel connected neon lamp 27, 29, 31. These networks are also mounted on the first PCB 10. If current flows through resistors 26, 28, and 30, the corresponding neon lamps 27, 29 and 31 are illuminated to indicate that the corresponding phase is energized.

Resistors 28 and 30 are connected together and thence connected to resistor 26 via a multimeter circuit which provides a deflection on meter 35 corresponding to the RMS voltage available between phases. The meter circuit comprises variable resistor 32 feeding a diode bridge 33 which rectifies the three phase AC. Rectified voltage is then fed via a multimeter circuit 34 comprising capacitor 34A, integrated circuit 34B, resistors 34C and 34D, variable resistor 34E, and resistor 34F to the meter 35. Components 32, 33, 34, and 35 are located on a separate second PCB board 11.

Also located on PCB 11 is a phase rotation indicator comprising two series connected neon lamps 24, 25. A resistor 23 is connected in parallel with the neon lamps 24, 25 and the parallel connection is connected to incoming resistor voltage dropping networks 18, 19 and 20, 21 respectively. The common connection between the neon lamps 24, 25 is connected via a voltage dropping and phase shifting capacitor 22 to the remaining incoming phase at wire 9. Depending on the phase relationship of the incoming voltages on the R, Y and B phases either one or the other of neon lamps 24, 25 will light in order to indicate phase rotation.

In the preferred embodiment the above described circuit is incorporated within a plug assembly based upon and in part comprising components from standard plug assemblies available in the mining industry as generally shown in FIGS. 2–5.

With particular reference to FIG. 2 a side section of the monitor plug of the preferred embodiment is shown comprising a cylindrical body casting 40 supporting earth sleeve 41 which together house connection ponts for three phase connections R, Y, B and a neutral N. The three phase connections R, Y, B are connected via fuses 4 (not shown), 5, 6 (not shown) located within fuse holders (as typified by fuse holder 42 in FIG. 6) to leads 7 (not shown), 8, 9 (not shown) which in turn connect to the components on PCB 10 as indicated in FIG. 1 and enclosed within the meter capsule 43. Details of the plug assembly entry socket 44 (one for each phase) are as shown in FIG. 6.

The first and second PCB boards 10, 11 are encapsulated using araldite or equivalent within the meter capsule 43 and oriented so that the neon lamps 27, 29, 31, 24 and 25 can be seen through the lens 45 which covers the rear of the monitor plug assembly. The lens 45 is sealed to the plug assembly and thus all the electrical components are effectively located within a flame proof enclosure. As a consequence the risk of explosion is substantially eliminated.

INDUSTRIAL APPLICABILITY

The above describes only one embodiment of the present invention and modifications, obvious to those skilled in the art, can be made thereto without departing from the scope and spirit of the present invention.

In particular the electrical components can be varied in order to accommodate and adjust to different expected high voltage inputs.

Also the assembly can be incorporated within other high voltage plug assemblies commonly used in industry in general and the mining industry in particular.

Whilst the preferred embodiment is preferred for use on 660 V or 1100 V installations, the principle of the invention can be used on higher and lower voltage networks in conjunction with suitable component valve and/or insulation modifications.

What I claim is:

1. Electrical testing apparatus for testing a multiphase alternating current supply outlet, said apparatus comprising a voltage dropping impedance network for each phase, and a corresponding phase energization indicator connected to each said voltage dropping impedance network, said networks and indicators being located within a housing with said indicators being visible from the exterior of said housing, and said housing having a socket connection for each phase compatible with said supply outlet and connected to the corresponding voltage droping network, and wherein said supply has three phases, a first and second phase rotation indicator are connected together in series with each other and between two of said voltage dropping impedance networks, a substantially resistive impedance is connected in parallel with said phase rotation indicators, and a phase shifting impedance is connected between the remaining voltage dropping impedance network or its corresponding socket connection, and the interconnection of said phase rotation indicators.

2. Electrical testing apparatus as claimed in claim 1 wherein each voltage dropping impedance network is connected to the input of a full wave rectifier, and a dc voltage measuring device is connected to the output of said rectifier.

3. Electrical testing apparatus as claimed in claim 2 wherein said voltage measuring device and all of said indicators are located interior of said housing behind a transparent member through which said indicators and voltage measuring device can be viewed.

4. Electrical testing apparatus as claimed in claim 3 wherein said housing has an interior which is sealed to the atmosphere, said voltage dropping impedance networks, said impedances, said indicators and said voltage measuring device being located within said sealed interior.

5. Electrical testing apparatus as claimed in claim 4 wherein said indicators are neon lamps and said voltage dropping impedance networks and said phase shifting impedance have impedance values selected to reduce the voltage of said supply to a safe operating voltage for said neon lamps.

* * * * *